(12) United States Patent
Zhou et al.

(10) Patent No.: US 10,056,445 B2
(45) Date of Patent: Aug. 21, 2018

(54) MANUFACTURE METHOD OF AMOLED PIXEL DRIVE CIRCUIT

(71) Applicant: Shenzhen China Star Optoelectronics Technology Co., Ltd., Shenzhen (CN)

(72) Inventors: Xingyu Zhou, Shenzhen (CN); Xiaoxing Zhang, Shenzhen (CN); Yuanjun Hsu, Shenzhen (CN); Yadi Zhang, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 247 days.

(21) Appl. No.: 15/120,745

(22) PCT Filed: Jun. 27, 2016

(86) PCT No.: PCT/CN2016/087329
§ 371 (c)(1),
(2) Date: Aug. 23, 2016

(87) PCT Pub. No.: WO2017/206243
PCT Pub. Date: Dec. 7, 2017

(65) Prior Publication Data
US 2018/0204897 A1      Jul. 19, 2018

(30) Foreign Application Priority Data

May 30, 2016   (CN) .......................... 2016 1 0371058

(51) Int. Cl.
*H01L 27/12* (2006.01)
*H01L 27/32* (2006.01)
(Continued)

(52) U.S. Cl.
CPC ...... *H01L 27/3262* (2013.01); *H01L 21/0217* (2013.01); *H01L 21/02043* (2013.01);
(Continued)

(58) Field of Classification Search
None
See application file for complete search history.

(56) References Cited

U.S. PATENT DOCUMENTS 9,530,854 B2 * 12/2016 Choi .................... H01L 27/3262
2007/0194316 A1 * 8/2007 Choi .................... G09G 3/3225
257/69

(Continued)

*Primary Examiner* — Alexander Ghyka
(74) *Attorney, Agent, or Firm* — Leong C. Lei

(57) ABSTRACT

The present invention provides a manufacture method of an AMOLED pixel driving circuit. The method utilizes the oxide semiconductor thin film transistor to be the switch thin film transistor of the AMOLED pixel driving circuit to reduce the leakage current of the switch thin film transistor, and the P type polysilicon thin film transistor manufactured by utilizing the Solid Phase Crystallization is employed to be the drive thin film transistor of the AMOLED pixel driving circuit to promote the mobility, the equality and the reliability of the drive thin film transistor, and utilizing the P type thin film transistor to be the drive thin film transistor can form the constant current type OLED element, which is more stable than the source follower type OLED formed by the N type thin film transistor, and meanwhile, the parasitic capacitance is decreased with the top gate structure.

17 Claims, 7 Drawing Sheets

(51) Int. Cl.
H01L 29/49 (2006.01)
H01L 21/02 (2006.01)
H01L 29/786 (2006.01)
H01L 29/167 (2006.01)
H01L 29/24 (2006.01)
H01L 29/66 (2006.01)
H01L 51/52 (2006.01)
H01L 51/00 (2006.01)

(52) U.S. Cl.
CPC .. *H01L 21/02164* (2013.01); *H01L 21/02422* (2013.01); *H01L 21/02532* (2013.01); *H01L 21/02565* (2013.01); *H01L 21/02592* (2013.01); *H01L 21/02667* (2013.01); *H01L 27/1218* (2013.01); *H01L 27/1222* (2013.01); *H01L 27/1225* (2013.01); *H01L 27/1248* (2013.01); *H01L 27/1251* (2013.01); *H01L 27/1255* (2013.01); *H01L 27/1274* (2013.01); *H01L 27/3246* (2013.01); *H01L 27/3248* (2013.01); *H01L 29/167* (2013.01); *H01L 29/24* (2013.01); *H01L 29/66757* (2013.01); *H01L 29/66969* (2013.01); *H01L 29/78675* (2013.01); *H01L 29/78696* (2013.01); *H01L 51/0096* (2013.01); *H01L 51/5206* (2013.01); *H01L 27/3258* (2013.01); *H01L 27/3265* (2013.01); *H01L 2227/323* (2013.01); *H01L 2251/308* (2013.01)

(56) References Cited

U.S. PATENT DOCUMENTS

| | | | |
|---|---|---|---|
| 2015/0179724 A1* | 6/2015 | Lee | H01L 27/3241 257/40 |
| 2016/0141558 A1* | 5/2016 | Cha | H01L 51/56 257/40 |
| 2016/0204180 A1* | 7/2016 | Lee | H01L 27/3241 438/23 |
| 2017/0125500 A1* | 5/2017 | Kim | H01L 21/0274 |
| 2017/0256569 A1* | 9/2017 | Ohara | H01L 21/02164 |
| 2018/0012948 A1* | 1/2018 | Lee | H01L 27/3276 |
| 2018/0061317 A1* | 3/2018 | Morita | G02F 1/13452 |

* cited by examiner

MANUFACTURE METHOD OF AMOLED PIXEL DRIVE CIRCUIT

FIELD OF THE INVENTION

The present invention relates to a display technology field, and more particularly to a manufacture method of an AMOLED pixel drive circuit.

BACKGROUND OF THE INVENTION

The Organic Light Emitting Diodes (OLED) display device possesses many outstanding properties of self-illumination, low driving voltage, high luminescence efficiency, short response time, high clarity and contrast, near 180° view angle, wide range of working temperature, applicability of flexible display and large scale full color display. The OLED is considered as the most potential display device.

The OLED can be categorized into two major types according to the driving methods, which are the Passive Matrix OLED (PMOLED) and the Active Matrix OLED (AMOLED), i.e. two types of the direct addressing and the Thin Film Transistor (TFT) matrix addressing. The AMOLED comprises pixels arranged in array and belongs to active display type, which has high lighting efficiency and is generally utilized for the large scale display devices of high resolution.

The AMOLED is a current driving element. When the electrical current flows through the organic light emitting diode, the organic light emitting diode emits light, and the brightness is determined according to the current flowing through the organic light emitting diode itself. Most of the present Integrated Circuits (IC) only transmit voltage signals. Therefore, the AMOLED pixel driving circuit needs to accomplish the task of converting the voltage signals into the current signals. The traditional AMOLED pixel driving circuit generally is 2T1C, which is a structure comprising two thin film transistors and one capacitor to convert the voltage into the current. The two thin film transistors respectively are the drive thin film transistor and the switch thin film transistor.

For the 2T1C AMOLED pixel driving circuit, the drive thin film transistor and the switch thin film transistor are usually the same type, and both are oxide thin film transistors or both are Poly Silicon thin film transistors. Although the mobility of the Low Temperature Poly Silicon (LTPS) thin film transistor based on the Excimer Laser Annealing (ELA) technology is high but the equality is poor, and the leakage current is higher. On the contrary, the equality of the oxide semiconductor thin film transistor is better, and the leakage current is low but the mobility is lower and the reliability is bad. Therefore, no matter the oxide semiconductor thin film transistor or the Poly Silicon thin film transistor is utilized, there are defects existing in the present 2T1C AMOLED pixel driving circuit.

SUMMARY OF THE INVENTION

An objective of the present invention is to provide an AMOLED pixel driving circuit, which can reduce the leakage current of the switch thin film transistor and can enhance the mobility and the reliability of the drive thin film transistor to decrease the parasitic capacitance.

For realizing the aforesaid objective, the present invention provides a manufacture method of an AMOLED pixel driving circuit, comprising steps of:

step 1, providing a substrate, and performing clean and pre-cure to the substrate;

step 2, depositing a buffer layer on the substrate, and depositing an amorphous silicon layer on the buffer layer;

step 3, performing P type ion doping and rapid thermal annealing to the amorphous silicon layer to crystallize the same into a polysilicon layer, and patterning the polysilicon layer to form a drive thin film transistor active layer and a storage capacitor lower electrode;

step 4, depositing a gate insulation layer on the drive thin film transistor active layer, the storage capacitor lower electrode and the buffer layer;

step 5, depositing a first metal layer on the gate insulation layer, and patterning the first metal layer to form a drive thin film transistor gate above the drive thin film transistor active layer and a switch thin film transistor gate, which is separately aligned with the drive thin film transistor gate, and a storage capacitor upper electrode located above the storage capacitor lower electrode;

step 6, depositing an interlayer insulation layer on the drive thin film transistor gate, the switch thin film transistor gate, the storage capacitor upper electrode and the gate insulation layer;

step 7, depositing an oxide semiconductor layer on the interlayer insulation layer, and patterning the oxide semiconductor layer to form a switch thin film transistor active layer above the switch thin film transistor gate;

step 8, patterning the interlayer insulation layer and the gate insulation layer to form a first via and a second via penetrating the interlayer insulation layer and the gate insulation layer to respectively expose two ends of the drive thin film transistor active layer with the first via and the second via;

step 9, depositing a second metal layer on the interlayer insulation layer and the switch thin film transistor active layer, and patterning the second metal layer to form a drive thin film transistor source, a drive thin film transistor drain, a switch thin film transistor source and a switch thin film transistor drain;

wherein the drive thin film transistor source and the drive thin film transistor drain respectively contact with two ends of the drive thin film transistor active layer through the first via and the second via;

the switch thin film transistor source and the switch thin film transistor drain respectively contact with two ends of the switch thin film transistor active layer;

the switch thin film transistor gate and the drive thin film transistor source are electrically coupled.

The substrate in the step 1 is a glass substrate.

All materials of the buffer layer, the gate insulation layer and the interlayer insulation layer are one or more combinations of silicon oxide and silicon nitride.

Both materials of the first metal layer and the second metal layer are molybdenum, aluminum or copper.

The P type ion doped in the step 3 is boron ion.

Material of the oxide semiconductor in the step 7 is IGZO or ITZO.

The manufacture method further comprises: step 10, sequentially forming a flat layer, a pixel electrode, a pixel definition layer and a pixel separation layer from top to bottom on the drive thin film transistor source, the drive thin film transistor drain, the switch thin film transistor source, the switch thin film transistor drain and the interlayer insulation layer.

A third via penetrating the flat layer is formed in a position on the flat layer corresponding to the drive thin film transistor drain; the pixel electrode contacts with the drive thin film transistor drain through the third via.

The pixel definition layer is formed with an opening at a position corresponding to the pixel electrode.

Material of the pixel electrode is ITO.

The present invention further provides a manufacture method of an AMOLED pixel driving circuit, comprising steps of:

step 1, providing a substrate, and performing clean and pre-cure to the substrate;

step 2, depositing a buffer layer on the substrate, and depositing an amorphous silicon layer on the buffer layer;

step 3, performing P type ion doping and rapid thermal annealing to the amorphous silicon layer to crystallize the same into a polysilicon layer, and patterning the polysilicon layer to form a drive thin film transistor active layer and a storage capacitor lower electrode;

step 4, depositing a gate insulation layer on the drive thin film transistor active layer, the storage capacitor lower electrode and the buffer layer;

step 5, depositing a first metal layer on the gate insulation layer, and patterning the first metal layer to form a drive thin film transistor gate above the drive thin film transistor active layer and a switch thin film transistor gate, which is separately aligned with the drive thin film transistor gate, and a storage capacitor upper electrode located above the storage capacitor lower electrode;

step 6, depositing an interlayer insulation layer on the drive thin film transistor gate, the switch thin film transistor gate, the storage capacitor upper electrode and the gate insulation layer;

step 7, depositing an oxide semiconductor layer on the interlayer insulation layer, and patterning the oxide semiconductor layer to form a switch thin film transistor active layer above the switch thin film transistor gate;

step 8, patterning the interlayer insulation layer and the gate insulation layer to form a first via and a second via penetrating the interlayer insulation layer and the gate insulation layer to respectively expose two ends of the drive thin film transistor active layer with the first via and the second via;

step 9, depositing a second metal layer on the interlayer insulation layer and the switch thin film transistor active layer, and patterning the second metal layer to form a drive thin film transistor source, a drive thin film transistor drain, a switch thin film transistor source and a switch thin film transistor drain;

wherein the drive thin film transistor source and the drive thin film transistor drain respectively contact with two ends of the drive thin film transistor active layer through the first via and the second via;

the switch thin film transistor source and the switch thin film transistor drain respectively contact with two ends of the switch thin film transistor active layer;

the switch thin film transistor gate and the drive thin film transistor source are electrically coupled;

wherein the substrate in the step 1 is a glass substrate;

wherein all materials of the buffer layer, the gate insulation layer and the interlayer insulation layer are one or more combinations of silicon oxide and silicon nitride;

wherein both materials of the first metal layer and the second metal layer are molybdenum, aluminum or copper.

The benefits of the present invention are: in the manufacture method of the AMOLED pixel driving circuit according to the present invention, the oxide semiconductor thin film transistor is utilized to be the switch thin film transistor of the AMOLED pixel driving circuit to reduce the leakage current of the switch thin film transistor, and the P type polysilicon thin film transistor manufactured by utilizing the Solid Phase Crystallization is employed to be the drive thin film transistor of the AMOLED pixel driving circuit to promote the mobility, the equality and the reliability of the drive thin film transistor, and utilizing the P type thin film transistor to be the drive thin film transistor can form the constant current type OLED element, which is more stable than the source follower type OLED formed by the N type thin film transistor, and meanwhile, the parasitic capacitance is decreased with the top gate structure.

BRIEF DESCRIPTION OF THE DRAWINGS

In order to better understand the characteristics and technical aspect of the invention, please refer to the following detailed description of the present invention is concerned with the diagrams, however, provide reference to the accompanying drawings and description only and is not intended to be limiting of the invention.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
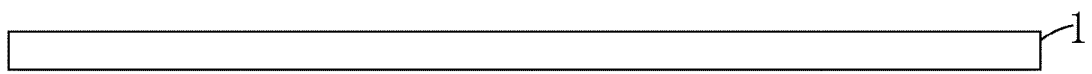
FIG. 1 is a diagram of the step 1 in the manufacture method of the AMOLED pixel driving circuit according to the present invention.
Figure 11:
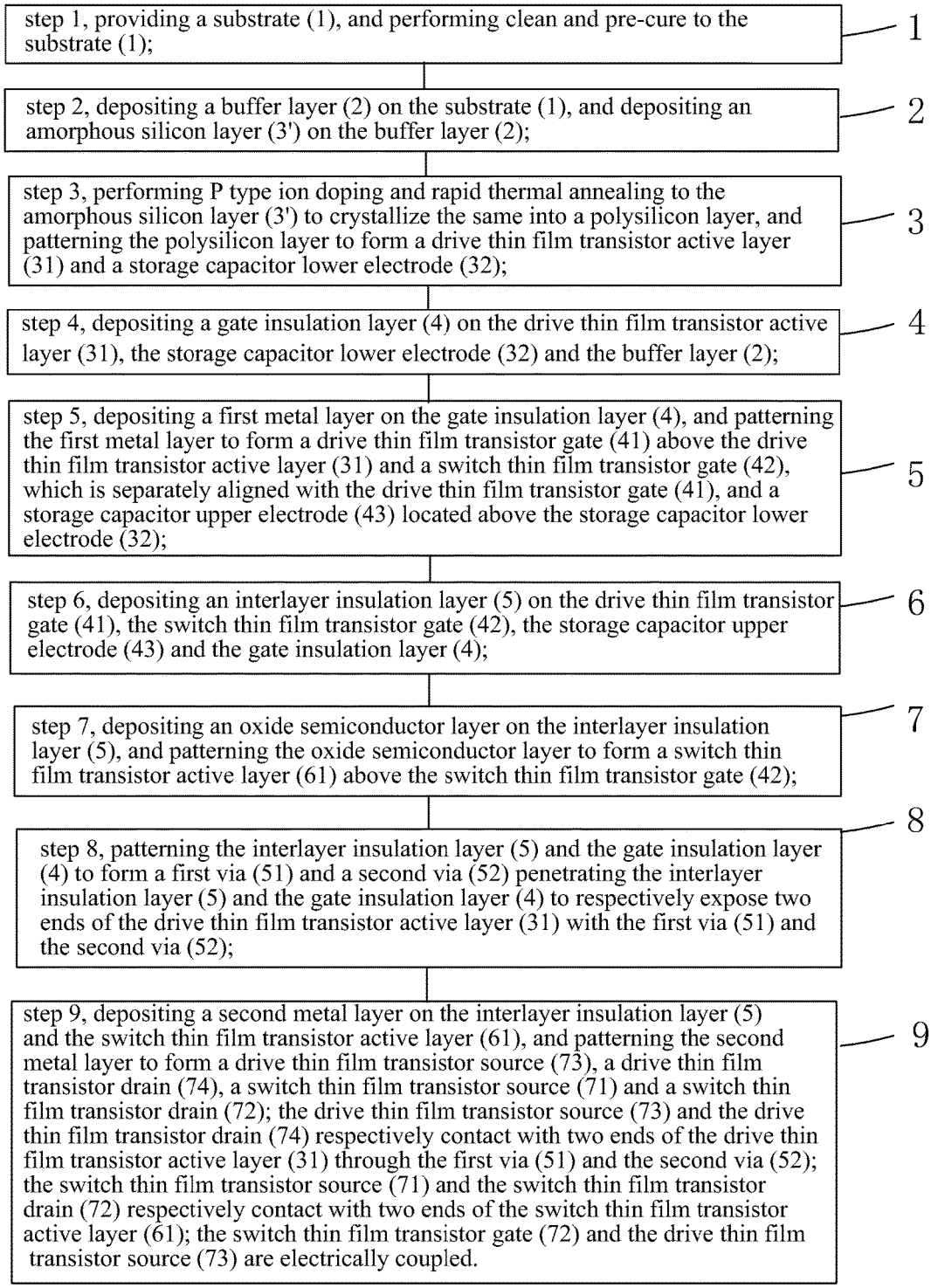
FIG. 11 is a flowchart of the manufacture method of the AMOLED pixel driving circuit according to the present invention.

Please refer to FIG. 11. The present invention provides a manufacture method of an AMOLED pixel driving circuit, comprising steps of:

step 1, referring to FIG. 1, providing a substrate 1, and performing clean and pre-cure to the substrate 1.

Figure 2:
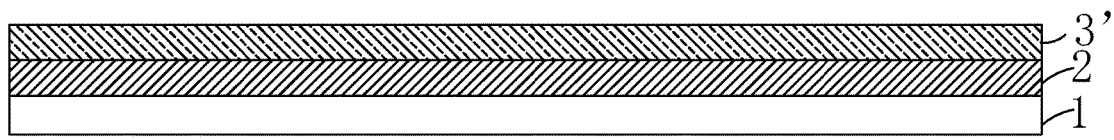
FIG. 2 is a diagram of the step 2 in the manufacture method of the AMOLED pixel driving circuit according to the present invention.

Specifically, the substrate 1 is a transparent substrate and preferably to be a glass substrate.

step 2, referring to FIG. 2, depositing a buffer layer 2 on the substrate 1, and depositing an amorphous silicon layer 3' on the buffer layer 2.

Figure 3:
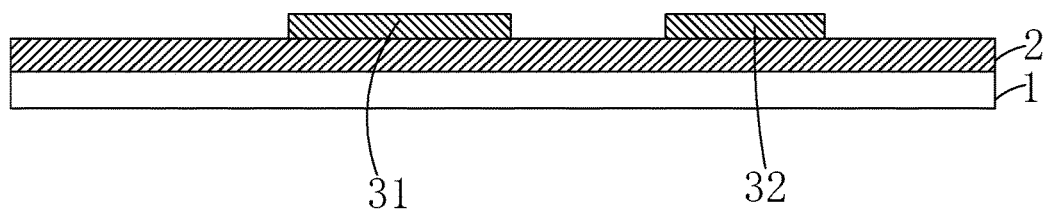
FIG. 3 is a diagram of the step 3 in the manufacture method of the AMOLED pixel driving circuit according to the present invention.

Specifically, material of the buffer layer 2 is one or more combinations of silicon oxide (SiOx) and silicon nitride (SiNx).

step 3, referring to FIG. 3, performing P type ion doping and rapid thermal annealing (RTA) to the amorphous silicon layer 3' to crystallize the same into a polysilicon layer, and patterning the polysilicon layer to form a drive thin film transistor active layer 31 and a storage capacitor lower electrode 32.

Specifically, the P type ion doped in the step 3 is boron (B) ion. The drive thin film transistor formed in the following is a P type thin film transistor with doping the P type ions. The P type thin film transistor can manufacture the constant current type OLED element, which is more stable than the source follower type OLED formed by the N type thin film transistor.

Figure 4:
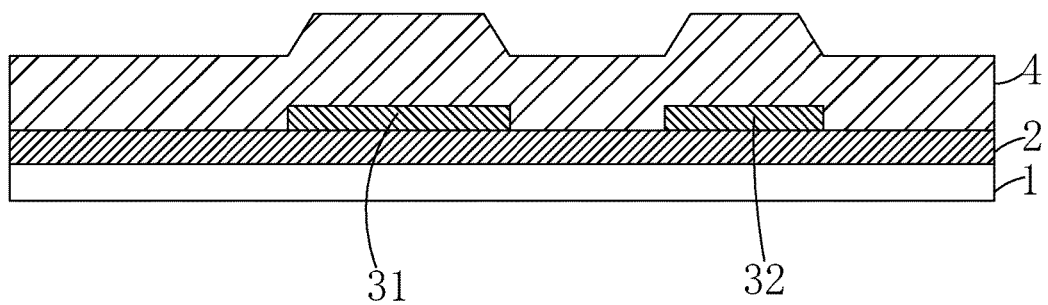
FIG. 4 is a diagram of the step 4 in the manufacture method of the AMOLED pixel driving circuit according to the present invention.

Furthermore, utilizing the polysilicon to be the drive thin film transistor active layer can promote the equality, reliability and mobility of the drive thin film transistor.

step 4, referring to FIG. 4, depositing a gate insulation layer 4 on the drive thin film transistor active layer 31, the storage capacitor lower electrode 32 and the buffer layer 2.

Figure 5:
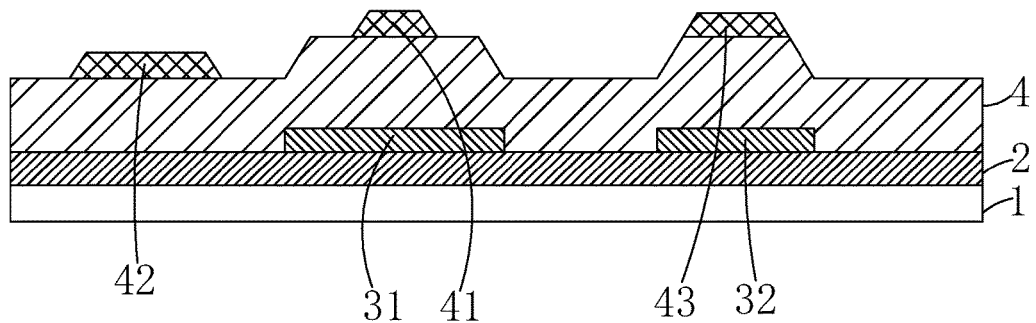
FIG. 5 is a diagram of the step 5 in the manufacture method of the AMOLED pixel driving circuit according to the present invention.

Specifically, material of the gate isolation layer 4 is one or more combinations of silicon oxide and silicon nitride.

step 5, referring to FIG. 5, depositing a first metal layer on the gate insulation layer 4, and patterning the first metal layer to form a drive thin film transistor gate 41 above the drive thin film transistor active layer 31 and a switch thin film transistor gate 42, which is separately aligned with the drive thin film transistor gate 41, and a storage capacitor upper electrode 43 located above the storage capacitor lower electrode 32.

Preferably, material of the first metal layer is molybdenum (Mo), aluminum (Al) or copper (Gu). The drive thin film transistor gate 41 is above the drive thin film transistor active layer 31 and thus to form a top gate type thin film transistor. The top gate type thin film transistor can significantly decrease the parasitic capacitance of the drive thin film transistor.

Figure 6:
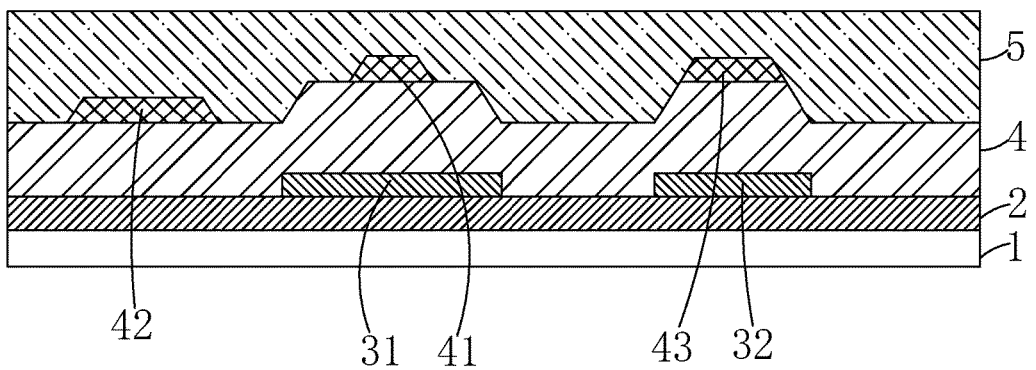
FIG. 6 is a diagram of the step 6 in the manufacture method of the AMOLED pixel driving circuit according to the present invention.

The storage capacitor lower electrode 32 and the storage capacitor upper electrode 43 commonly construct the storage capacitor of the AMOLED pixel driving circuit.

step 6, referring to FIG. 6, depositing an interlayer insulation layer 5 on the drive thin film transistor gate 41, the switch thin film transistor gate 42, the storage capacitor upper electrode 43 and the gate insulation layer 4.

Figure 7:
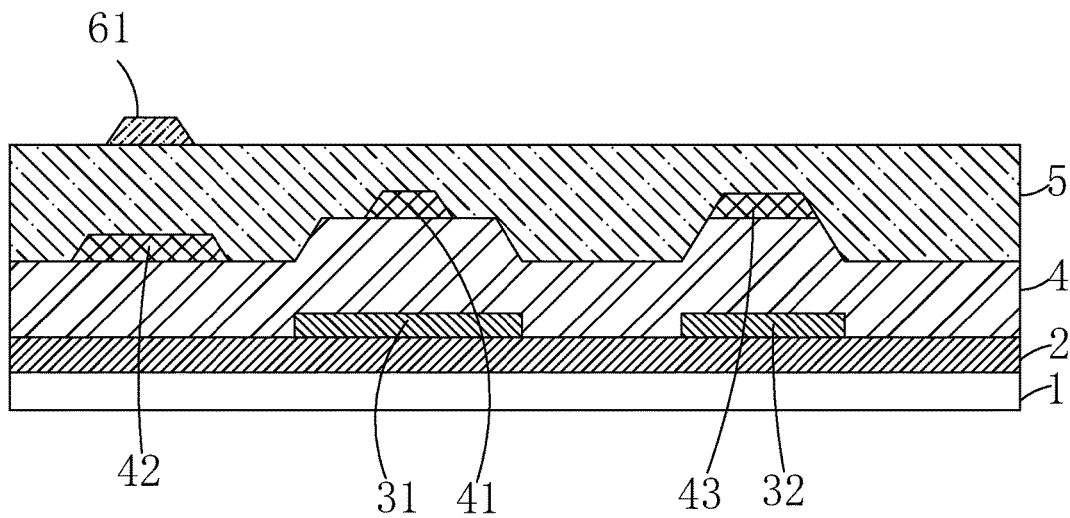
FIG. 7 is a diagram of the step 7 in the manufacture method of the AMOLED pixel driving circuit according to the present invention.

Specifically, material of the interlayer insulation layer 5 is one or more combinations of silicon oxide and silicon nitride.

step 7, referring to FIG. 7, depositing an oxide semiconductor layer on the interlayer insulation layer 5, and patterning the oxide semiconductor layer to form a switch thin film transistor active layer 61 above the switch thin film transistor gate 42.

Preferably, material of the oxide semiconductor layer is Indium Gallium Zinc Oxide (IGZO) or Indium Titanium Zinc Oxide (ITZO).

Figure 8:
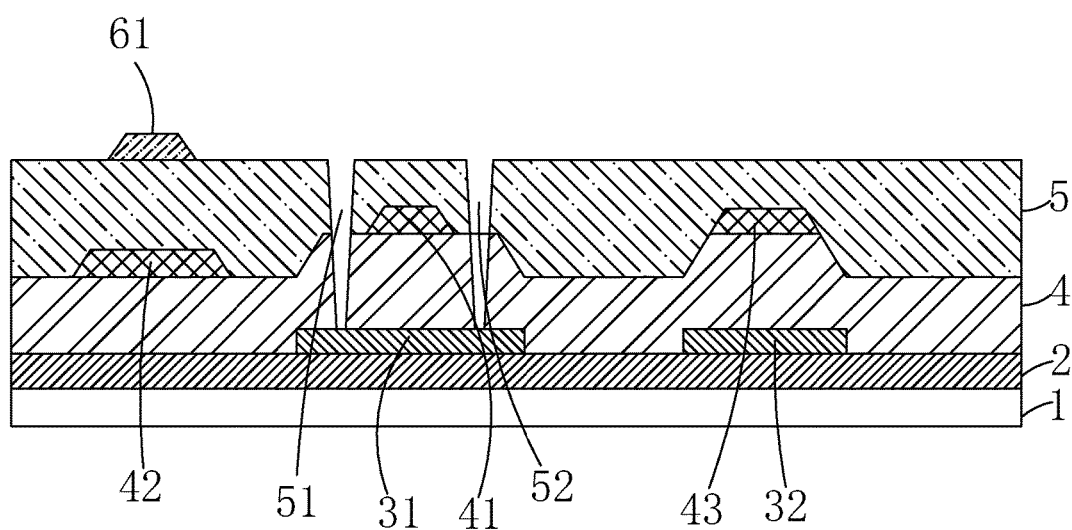
FIG. 8 is a diagram of the step 8 in the manufacture method of the AMOLED pixel driving circuit according to the present invention.
Figure 9:
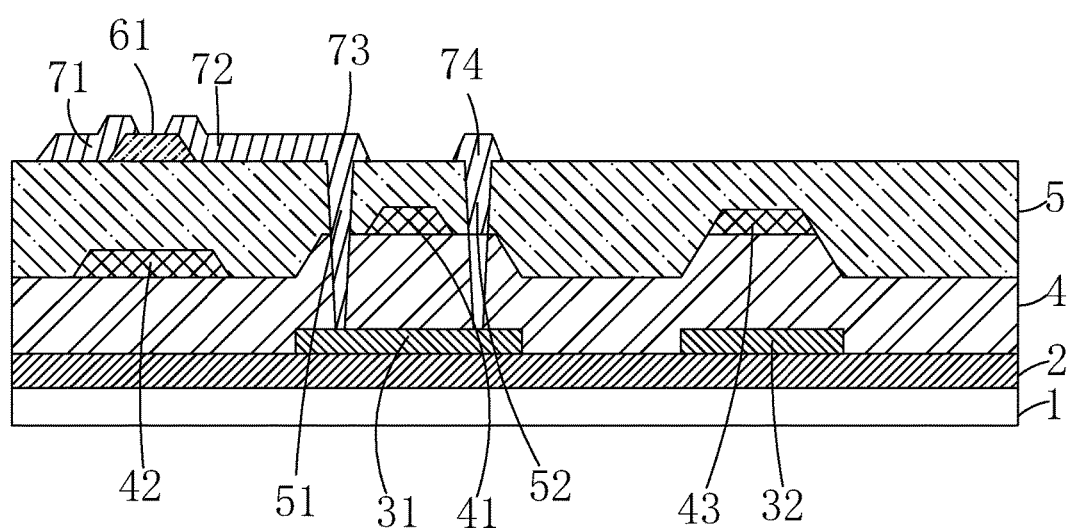
FIG. 9 is a diagram of the step 9 in the manufacture method of the AMOLED pixel driving circuit according to the present invention.

Furthermore, utilizing the oxide semiconductor to be the switch thin film transistor active layer 61 can reduce the leakage current of the switch thin film transistor.

step 8, referring to FIG. 8, patterning the interlayer insulation layer 5 and the gate insulation layer 4 to form a first via 51 and a second via 52 penetrating the interlayer insulation layer 5 and the gate insulation layer 4 to respectively expose two ends of the drive thin film transistor active layer 31 with the first via 51 and the second via 52.

step 9, referring to FIG. 9, depositing a second metal layer on the interlayer insulation layer 5 and the switch thin film transistor active layer 61, and patterning the second metal layer to form a drive thin film transistor source 73, a drive thin film transistor drain 74, a switch thin film transistor source 71 and a switch thin film transistor drain 72.

Specifically, the drive thin film transistor source 73 and the drive thin film transistor drain 74 respectively contact with two ends of the drive thin film transistor active layer 31 through the first via 51 and the second via 52.

The drive thin film transistor source 73, the drive thin film transistor drain 74, the drive thin film transistor gate 41 and the switch thin film transistor gate 42 commonly construct the drive thin film transistor of the AMOLED pixel driving circuit.

The switch thin film transistor source 71 and the switch thin film transistor drain 72 respectively contact with two ends of the switch thin film transistor active layer 61.

The switch thin film transistor source 71, the switch thin film transistor drain 72, the switch thin film transistor gate 42 and the switch thin film transistor active layer 61 commonly construct the switch thin film transistor of the AMOLED pixel driving circuit.

Figure 10:
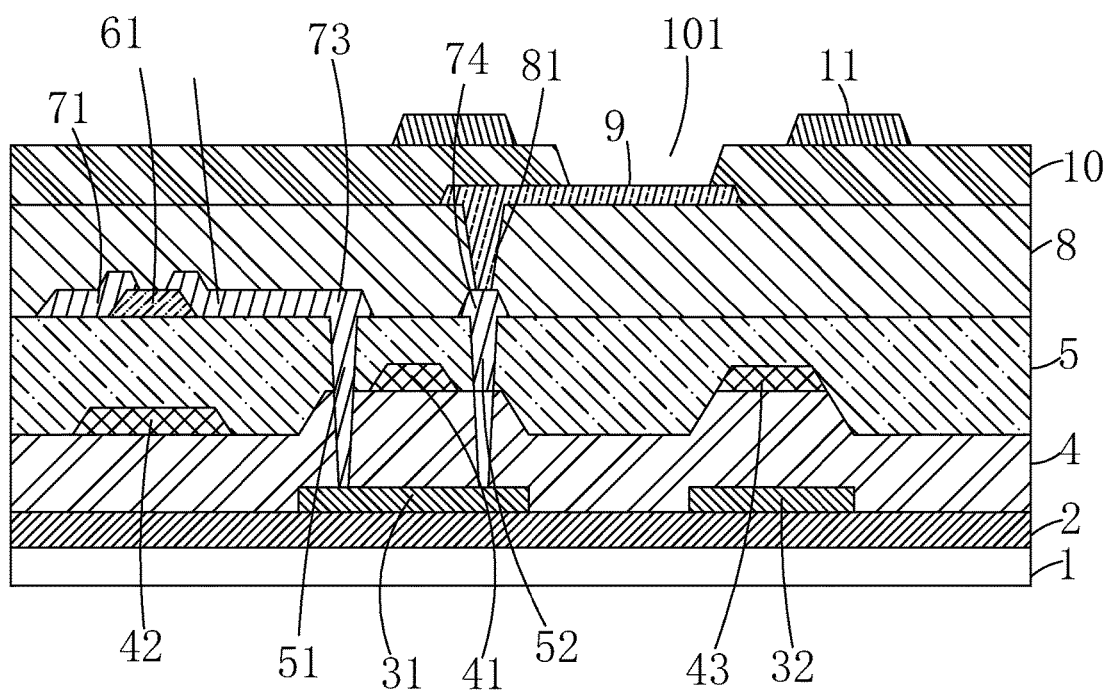
FIG. 10 is a diagram of the step 10 in the manufacture method of the AMOLED pixel driving circuit according to the present invention.

The switch thin film transistor gate 72 and the drive thin film transistor source 73 are electrically coupled. The switch thin film transistor, the drive thin film transistor and the storage capacitor commonly construct a 2T1C type AMOLED pixel driving circuit.

step 10, referring to FIG. 10, sequentially forming a flat layer 8, a pixel electrode 9, a pixel definition layer 10 and a pixel separation layer 11 from top to bottom on the drive thin film transistor source 73, the drive thin film transistor drain 74, the switch thin film transistor source 71, the switch thin film transistor drain 72 and the interlayer insulation layer 5.

Specifically, a third via 81 penetrating the flat layer 8 is formed in a position on the flat layer 8 corresponding to the drive thin film transistor drain 72, and the pixel electrode 9 contacts with the drive thin film transistor drain 74 through the third via 81. The pixel definition layer 10 is formed with an opening 101 at a position corresponding to the pixel electrode 9. The opening 101 is employed to deposit an organic function layer of the OLED element to form an organic light emitting diode.

Preferably, material of the flat layer 8 is one or more combinations of silicon oxide and silicon nitride.

Preferably, material of the pixel electrode 9 is Indium Tin Oxide (ITO).

In conclusion, in the manufacture method of the AMOLED pixel driving circuit according to the present invention, the oxide semiconductor thin film transistor is utilized to be the switch thin film transistor of the AMOLED pixel driving circuit to reduce the leakage current of the switch thin film transistor, and the P type polysilicon thin film transistor manufactured by utilizing the Solid Phase Crystallization is employed to be the drive thin film transistor of the AMOLED pixel driving circuit to promote the mobility, the equality and the reliability of the drive thin film transistor, and utilizing the P type thin film transistor to be the drive thin film transistor can form the constant current type OLED element, which is more stable than the source follower type OLED formed by the N type thin film transistor, and meanwhile, the parasitic capacitance is decreased with the top gate structure.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A manufacture method of an AMOLED pixel driving circuit, comprising steps of:
    step 1, providing a substrate, and performing clean and pre-cure to the substrate;
    step 2, depositing a buffer layer on the substrate, and depositing an amorphous silicon layer on the buffer layer;
    step 3, performing P type ion doping and rapid thermal annealing to the amorphous silicon layer to crystallize the same into a polysilicon layer, and patterning the polysilicon layer to form a drive thin film transistor active layer and a storage capacitor lower electrode;
    step 4, depositing a gate insulation layer on the drive thin film transistor active layer, the storage capacitor lower electrode and the buffer layer;
    step 5, depositing a first metal layer on the gate insulation layer, and patterning the first metal layer to form a drive thin film transistor gate above the drive thin film transistor active layer and a switch thin film transistor gate, which is separately aligned with the drive thin film transistor gate, and a storage capacitor upper electrode located above the storage capacitor lower electrode;
    step 6, depositing an interlayer insulation layer on the drive thin film transistor gate, the switch thin film transistor gate, the storage capacitor upper electrode and the gate insulation layer;
    step 7, depositing an oxide semiconductor layer on the interlayer insulation layer, and patterning the oxide semiconductor layer to form a switch thin film transistor active layer above the switch thin film transistor gate;
    step 8, patterning the interlayer insulation layer and the gate insulation layer to form a first via and a second via penetrating the interlayer insulation layer and the gate insulation layer to respectively expose two ends of the drive thin film transistor active layer with the first via and the second via;
    step 9, depositing a second metal layer on the interlayer insulation layer and the switch thin film transistor active layer, and patterning the second metal layer to form a drive thin film transistor source, a drive thin film transistor drain, a switch thin film transistor source and a switch thin film transistor drain;
    wherein the drive thin film transistor source and the drive thin film transistor drain respectively contact with two ends of the drive thin film transistor active layer through the first via and the second via;
    the switch thin film transistor source and the switch thin film transistor drain respectively contact with two ends of the switch thin film transistor active layer;
    the switch thin film transistor gate and the drive thin film transistor source are electrically coupled.

2. The manufacture method of the AMOLED pixel driving circuit according to claim 1, wherein the substrate in the step 1 is a glass substrate.

3. The manufacture method of the AMOLED pixel driving circuit according to claim 1, wherein all materials of the buffer layer, the gate insulation layer and the interlayer insulation layer are one or more combinations of silicon oxide and silicon nitride.

4. The manufacture method of the AMOLED pixel driving circuit according to claim 1, wherein both materials of the first metal layer and the second metal layer are molybdenum, aluminum or copper.

5. The manufacture method of the AMOLED pixel driving circuit according to claim 1, wherein the P type ion doped in the step 3 is boron ion.

6. The manufacture method of the AMOLED pixel driving circuit according to claim 1, wherein material of the oxide semiconductor in the step 7 is IGZO or ITZO.

7. The manufacture method of the AMOLED pixel driving circuit according to claim 1, further comprising: step 10, sequentially forming a flat layer, a pixel electrode, a pixel definition layer and a pixel separation layer from top to bottom on the drive thin film transistor source, the drive thin film transistor drain, the switch thin film transistor source, the switch thin film transistor drain and the interlayer insulation layer.

8. The manufacture method of the AMOLED pixel driving circuit according to claim 7, wherein a third via penetrating the flat layer is formed in a position on the flat layer corresponding to the drive thin film transistor drain; the pixel electrode contacts with the drive thin film transistor drain through the third via.

9. The manufacture method of the AMOLED pixel driving circuit according to claim 7, wherein the pixel definition layer is formed with an opening at a position corresponding to the pixel electrode.

10. The manufacture method of the AMOLED pixel driving circuit according to claim 7, wherein material of the pixel electrode is ITO.

11. A manufacture method of an AMOLED pixel driving circuit, comprising steps of:
    step 1, providing a substrate, and performing clean and pre-cure to the substrate;
    step 2, depositing a buffer layer on the substrate, and depositing an amorphous silicon layer on the buffer layer;
    step 3, performing P type ion doping and rapid thermal annealing to the amorphous silicon layer to crystallize the same into a polysilicon layer, and patterning the polysilicon layer to form a drive thin film transistor active layer and a storage capacitor lower electrode;
    step 4, depositing a gate insulation layer on the drive thin film transistor active layer, the storage capacitor lower electrode and the buffer layer;
    step 5, depositing a first metal layer on the gate insulation layer, and patterning the first metal layer to form a drive thin film transistor gate above the drive thin film transistor active layer and a switch thin film transistor gate, which is separately aligned with the drive thin film transistor gate, and a storage capacitor upper electrode located above the storage capacitor lower electrode;
    step 6, depositing an interlayer insulation layer on the drive thin film transistor gate, the switch thin film transistor gate, the storage capacitor upper electrode and the gate insulation layer;
    step 7, depositing an oxide semiconductor layer on the interlayer insulation layer, and patterning the oxide semiconductor layer to form a switch thin film transistor active layer above the switch thin film transistor gate;

step 8, patterning the interlayer insulation layer and the gate insulation layer to form a first via and a second via penetrating the interlayer insulation layer and the gate insulation layer to respectively expose two ends of the drive thin film transistor active layer with the first via and the second via;

step 9, depositing a second metal layer on the interlayer insulation layer and the switch thin film transistor active layer, and patterning the second metal layer to form a drive thin film transistor source, a drive thin film transistor drain, a switch thin film transistor source and a switch thin film transistor drain;

wherein the drive thin film transistor source and the drive thin film transistor drain respectively contact with two ends of the drive thin film transistor active layer through the first via and the second via;

the switch thin film transistor source and the switch thin film transistor drain respectively contact with two ends of the switch thin film transistor active layer;

the switch thin film transistor gate and the drive thin film transistor source are electrically coupled;

wherein the substrate in the step 1 is a glass substrate;

wherein all materials of the buffer layer, the gate insulation layer and the interlayer insulation layer are one or more combinations of silicon oxide and silicon nitride;

wherein both materials of the first metal layer and the second metal layer are molybdenum, aluminum or copper.

12. The manufacture method of the AMOLED pixel driving circuit according to claim 11, wherein the P type ion doped in the step 3 is boron ion.

13. The manufacture method of the AMOLED pixel driving circuit according to claim 11, wherein material of the oxide semiconductor in the step 7 is IGZO or ITZO.

14. The manufacture method of the AMOLED pixel driving circuit according to claim 11, further comprising: step 10, sequentially forming a flat layer, a pixel electrode, a pixel definition layer and a pixel separation layer from top to bottom on the drive thin film transistor source, the drive thin film transistor drain, the switch thin film transistor source, the switch thin film transistor drain and the interlayer insulation layer.

15. The manufacture method of the AMOLED pixel driving circuit according to claim 14, wherein a third via penetrating the flat layer is formed in a position on the flat layer corresponding to the drive thin film transistor drain; the pixel electrode contacts with the drive thin film transistor drain through the third via.

16. The manufacture method of the AMOLED pixel driving circuit according to claim 14, wherein the pixel definition layer is formed with an opening at a position corresponding to the pixel electrode.

17. The manufacture method of the AMOLED pixel driving circuit according to claim 14, wherein material of the pixel electrode is ITO.

* * * * *